Figure 1:
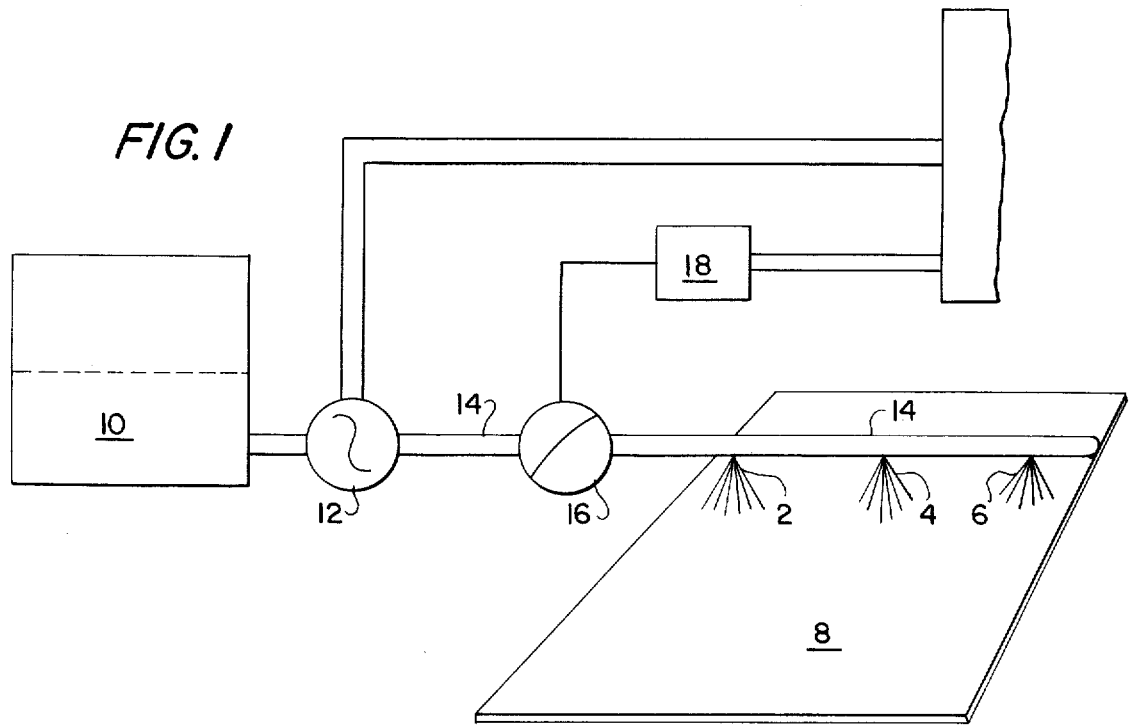

United States Patent [19]

Horner

[11] 3,937,175
[45] Feb. 10, 1976

[54] PULSED SPRAY OF FLUIDS
[75] Inventor: Ellwood J. Horner, Armonk, N.Y.
[73] Assignee: American Hoechst Corporation, Bridgewater, N.J.
[22] Filed: Dec. 26, 1973
[21] Appl. No.: 427,673

[52] U.S. Cl. .................................. 118/7; 118/315
[51] Int. Cl.² ...................... B05C 11/00; B05B 1/08
[58] Field of Search ............ 118/2, 3, 7, 313, 314, 118/315; 239/101

[56] References Cited
UNITED STATES PATENTS

| | | | |
|---|---|---|---|
| 3,360,400 | 12/1967 | Evans et al. | 239/101 |
| 3,402,695 | 9/1968 | Baker et al. | 118/315 |
| 3,448,720 | 6/1969 | Graham | 118/314 |
| 3,452,710 | 7/1969 | Hentschel | 118/7 |
| 3,682,131 | 8/1972 | Algeri et al. | 118/2 |
| 3,815,544 | 6/1974 | Rood et al. | 118/2 |

Primary Examiner—Mervin Stein
Assistant Examiner—Douglas Salser
Attorney, Agent, or Firm—James E. Bryan

[57] ABSTRACT

Method and apparatus for automatically spraying a liquid on the surface of a moving object, particularly developer, rinse and gumming liquids on an exposed, photosensitive printing plate, in which the liquid is continuously supplied to a distribution line at a predetermined pressure, and simultaneously with the supply of liquid, the object is transported past a spray means connected to the distribution line, an impinging spray of the liquid is alternately applied to the object for a first predetermined period and the application is interrupted for a second predetermined period and the cycle is repeated a plurality of times during the passage of the object past the spray means, as by a solenoid valve mounted in the distribution line and a timer connected to the solenoid valve to open and close the same.

15 Claims, 2 Drawing Figures

U.S. Patent   Feb. 10, 1976   3,937,175

3,937,175

PULSED SPRAY OF FLUIDS

The present invention relates to means for improved procedures and apparatus in the art of machine spray-developing of lithographic and photopolymer letterpress printing plates or cleaning, etching and chemical processing flat sheets or webs. It also relates to improved procedures and apparatus for spray-coating protective and decorative finishes onto flat surfaces.

In the field of preparing lithographic and photopolymer letterpress printing plates, light sensitive coatings are placed upon a support, usually a flexible, thin metal sheet, thus creating a presensitized printing plate. The plate is subjected to imagewise exposure through a mask which renders the photosensitive substance insoluble in a suitably chosen developer, if it is negative working; and soluble in the developer, if the plate is positive working. The action of the developer, in the case of a lithographic plate, is to if the non-image portions of the plate coating completely so that no trace of it remains on the metal support. The metal support, so revealed, is now free of coating and will no longer accept ink. This sharp discrimination between image and non-image areas on the plate is vital to success in the preparation of a lithographic plate.

Exposed lithographic plates may be developed by hand or by machine. If developed by hand, developer is poured both upon the plate and upon a soft sponge or pad and rubbed therewith upon the surface of the plate until, by inspection, the non-image areas are completely removed. Care must be taken to avoid any damage to the image by excessive rubbing, or by the use of an overly active chemical developer. When many plates are to be developed, machinery is used which will develop the plate by applying developer mechanically. In some existing machines, developer is metered to the plate through tubes and spread about by sponges or brushes which also serve to separate loosened non-image particles from the plate support. In a next stage, within the machine, the spent developer and separated non-image coating are rinsed from the plate, usually with water, supplied through tubes. In a final stage, the rinsed, moist surface is covered with a gum solution and any excess thereof is removed, thereby delivering a plate ready for the press or for storage. The gum solution is also metered to the plate through tubes.

In some cases, these processing solutions are pumped through spray nozzles which are directed upon the plate surface. In further refinements, the developer and gum solution overflows are returned to reservoirs from which they are again pumped through the spray nozzles. For purposes of this application, such use of sprays is termed continuous even though the spray runs only while a plate is under it.

In the case of alkaline developers for certain positive working plates, recirculation is not feasible due to the aeration of the developer. This results in the absorption of carbon dioxide, always present in the air, with consequent lowering of the pH and early sharp reduction of developer efficiency. In this case, to avoid aeration, only fresh developer may be applied to the plate. A normal spray uses a large volume of developer and is very wasteful. Moreover, despite the need to clean out non-image areas completely, too aggressive a developer must be avoided for, alone or in combination with a brushing action, it may soften and damage the image areas, thus ruining the plate.

In the case of a photopolymer letterpress plate, which has a thickness of .010 to about .040 inch, it is not necessary to clean nonimage areas down to the support metal. It is sufficient to provide an elevational differential between the remainder of the plate and the plane of the printing surface, which printing surface alone is exposed to ink and transfers it to the surface to be printed upon.

Photopolymer letterpress plates are exposed under a negative to harden the photopolymer imagewise and then, in at least one instance, are mounted on a drum and subjected to the action of a continuous spray of a developing solution to remove the still soluble non-image coating. Metal etching in imagewise patterns is normally conducted by spraying thereon chemical etchants, such as, acids, alkalis, ammonium persulphate, ferric chloride. Prior to the etching operations, photosensitive coatings known as photoresists are applied to the surface of the metal. This coating is imaged through a mask, then developed to lay bare the portions of metal which are to be selectively removed. Chemical etching is used in the arts of photoengraving, photochemical machining, printed circuit manufacturing, and photogravure.

In the art of protective and decorative coating, spraying is widely used as an alternative to dipping or roller coating. Fine, continuously operating, misting sprayers are used which are designed to give great evenness of coverage and, when combined with careful formulation of the coating solution, a uniform film which will remain smooth during drying without formation of undesired sagging or wrinkling. As corrosion protection of the metal is often required, and excellent adhesion is always important, primer coats are usually first applied, with the same spraying equipment. The importance of preparation of the surface to be coated is well known, if maximum durability of the coating is to be obtained. To this end, surfaces are variously cleaned chemically or mechanically (as by abrasion) to foster good adhesion. A newer and more expensive technique to obtain optimum primer coating is electro-chemical deposition.

It is an object of this invention to increase the force of impingement on the surfaces and penetration of fluids into such surfaces.

With regard to developing machinery utilized in the graphic arts, other objects are:
1. To reduce the needed quantities of valuable developers and finishing agents.
2. To increase the speed of operation.
3. To increase the completeness of development.
4. To increase the discrimination between image and non-image areas.
5. To permit the use of less aggressive developer, and thus decrease damage to the image.

With regard to protective and decorative coatings, it is also an object of this invention to increase the adhesion of such coatings. It is a further object hereto to increase the speed of chemical etching operations.

In machinery for the processing of exposed lithographic and photopolymer printing plates, utilizing this invention, the plate is transported under spray heads through which developing solutions, rinses, and finishing solutions, as determined by the needs of the individual plate, are sequentially dispensed. Appropriate time intervals are provided for the action of each solution, optionally assisted by soft non-scratching brushes, scrubbing pads, squeegees and the like. The various manifolds to which the spray nozzles are attached are equipped with pumps and solenoid valves electrically actuated by a timer mechanism. The timer is adjusted to cause the valve to open and close rapidly. During the closed phase of the cycle, the fluid pressure builds up to the ultimate capability of the pump. Upon opening of the valve, the fluid, under pressure, is suddenly ejected upon the target to accomplish the impingement on and penetration into the target beyond that which would have been obtained with continuous spraying. The effects of this improved impingement and penetration are to clean out unwanted image areas more quickly and thoroughly while at the same time reducing the volume of needed developer.

Figure 2:
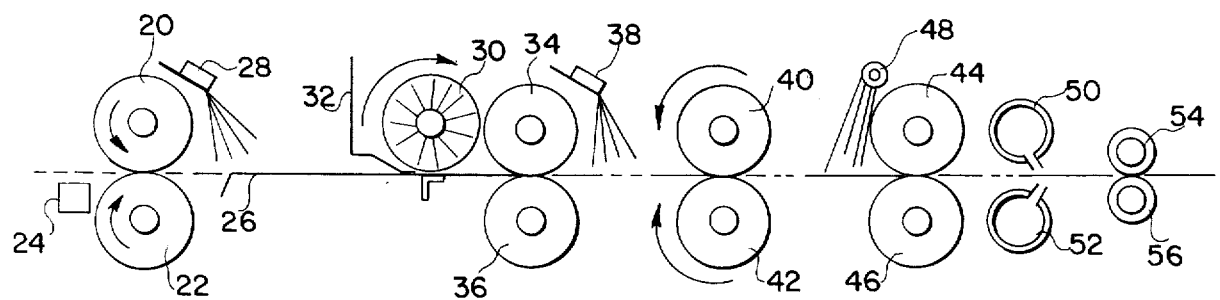

For a better understanding of the present invention, reference is made to the accompanying drawings wherein:

FIG. 1 is a schematic representation of the major components of the pulsed spray system of the present invention; and FIG. 2 is a schematic representation of a one-sided printing plate processor showing the location of the developer nozzles, rinse nozzles and gum dispensing tube which can incorporate the pulsed spray system of the present invention.

In FIG. 1, spray heads or jets 2, 4 and 6 impinge upon article 8, which may be an exposed lithographic printing plate, a photopolymer letterpress plate, an article to be chemically etched, or an article to be provided with a protective or decorative coating. The contents of reservoir 10 may be a developing solution, a rinse, a finishing solution, a chemical etch solution or a coating solution, which includes primers in the latter category. The contents of the reservoir 10 are propelled by pump 12 through manifold 14, in which the aforementioned sprayheads or jets 2, 4 and 6 are mounted. A solenoid valve 16, regulated by an electric timer 18, alternately opens and closes, thus pulsing fluid from the reservoir 10 through the spray heads 2, 4 and 6. An optional conduit (not shown) may be employed to return the fluid to the reservoir. Fluid is used but once when aeration or pick up of material after contact with article 8 would change its composition excessively and render it unsuitable for reuse.

Spraying is dependent upon hydraulic pressure usually developed by a hydraulic pump. Hydraulic pumps are of the following types: gear, vane, piston, and screw. The selection of the type of pump depends upon application and usually the user has a choice of at least two types. Cost, efficiency, and maintenance are the governing factors in making a final selection. A multiple piston type pump, because of these factors, and because it is capable of delivering high pressure, is most commonly chosen for spraying. Piston pumps are available in a variety of sizes and flow rates. Most spraying system requirements generally are in the 10 to 150 p.s.i. range, however, there are some that require up to 500 p.s.i. The flow rate varies from 0.02 to 20 G.P.M. for different spray applications. Spraying is usually employed where a thin coverage of liquid is desirable, and the flow rate range for these applications would be 0.02 to 0.5 G.P.M. This is particularly true when using pulse spraying as taught herein. "Pulse spraying," as used herein, may be defined as alternately and repetitively spraying a liquid for a first period of time and then not spraying a liquid for a second period of time. This sequence, constantly repeated, causes the spray to be pulsed. The member in a hydraulic system used to create this action is a solenoid valve. A solenoid valve is a combination of two basic functional units — (1) a solenoid (electro-magnet) with a plunger (or core); and (2) a valve containing an orifice in which a disc or plug is positioned to stop or allow gas or liquid flow. The valve is opened or closed by movement of the magnetic plunger which is drawn into the solenoid coil when it is energized by an electrical current. Valves are usually of the direct acting type, where the disc opens and closes the orifice directly, or the internal type where the valve utilizes the line pressure for operation. Valves are made for various types of operation such as: two-way; three-way, and four-way and to normally open or normally close, the solenoid being de-energized in the specified positions. Valves can also be supplied to operate at pressures up to 1,500 p.s.i. and flow requirements up to 1,000 G.P.M. However, these ranges far exceed those of the hydraulic pump and for use in spraying systems for which, as previously noted, 0.02 to 0.5 G.P.M. is useful in this invention.

The small direct acting valve used for spray applications can react in as little as milliseconds, which is ideal for pulse spraying.

As noted above, the solenoid valve requires electric current to energize the solenoid. Since pulse spraying requires the valve to be alternately open for a period of time and closed for a period of time, the electric current has to be supplied accordingly. This is accomplished by an electric timer. Electric timers are usually of two types: the electric clock type that is driven by an electric motor wherein the cycles of the electric current regulate its accuracy, and the solid state type with no mechanical moving parts. The current requirements to operate a solenoid valve for spraying are not great. The timer is generally positioned in an electrical circuit so that it operates a relay, which also requires very little current to operate. Timers can be supplied in various ranges such as 0 to 15 seconds, 0 to 60 seconds, 0 to 15 minutes, etc. They can also be supplied with adjustable "on" and "off" time cycles as well as set periods of "on" and "off" cycles. Either one can be used with pulse spraying depending upon the requirements of the system.

Spray heads are usually classified as to the pattern they produce, such as the hollow cone, solid cone, flat spray and square spray. The nozzles can be supplied with orifices from .018 inch to .750 inch diameter, for pressures up to 500 p.s.i. and for delivery rates from .035 to 100 G.P.M. Hence, users have a wide selection to incorporate into their system. For continuous or intermittent use in cleaning, coating, etching, and chemical processing of flat sheets, the flat spray head is used because of its uniform application and controlled pattern. For this type of application, the smaller orifice diameter nozzles would be selected and usually they are only required to operate between 40 and 150 p.s.i. pressure.

The essence of the instant invention is the pulsation of the spray, obtained as described by opening and closing the valve.

When the closed phase of the cycle is too brief, fluid pressure cannot build up to its maximum, and no improvement in force is obtained. As the duration of the closed phase is progressively increased, and desired pressure increase is obtained up to a point, after which a further increase in closed time no longer provides any pressure increase and is not worthwhile.

The time during which the valve is open is equally important in this invention. If the closed valve is opened for too brief a time, too little fluid (albeit at the desired high pressure) is delivered through the jet upon the work surface. If the valve is open too long, a condition approaching continuous spraying results. Therefore, the desirable open time for the valve is one which just allows delivery of the fluid under high pressure.

The optimum cycle for open and closed times of the valve depends greatly upon the type of spray head, the pressure required for the system, the distance from the jet to the surface which is to receive the spray, and the travel rate of the work relative to the spray heads. Because of these interrelated parameters, it is not possible to generalize with regard to the optimum cycle for each application. However, with a knowledge of the various parameters and their importance as revealed herein, and a little experimentation, it is possible for one skilled in the art to select operable conditions for the desired application.

FIG. 2 shows a schematic representation of a printing plate processor in flow diagram form. The plate is fed into the feed rollers 20 and 22 and simultaneously contacts proximity switch 24 which starts the automatic operation of the processor. As the plate passes the exit side of feed rollers 20 and 22, it travels along support plate 26 and is sprayed with developer fluid by means of developer dispensing nozzles 28. Developer dispensing nozzles 28 are equipped for pulsed spraying as illustrated in FIG. 1. After traveling along support plate 26, the plate is fed to a counterrotating brush 30 which removes the loosened, unwanted coating from the plate. Desirably, the plate passes under guide plate 32 which pervents repulsion of the plate by counterrotating brush 30 and thereby prevents plate damage. The plate then passes through developer-transport-squeegee rollers 34 and 36. At the exit side of rollers 34 and 36, the plate is sprayed by rinse dispensing nozzles 38 where residual developer is washed off. Rinse dispensing nozzles 38 also incorporate the pulsed spray system of the present invention. Rinse-transport-squeegee rollers 40 and 42 then transport the plate to gum applicator-transport-squeegee rollers 44 and 46 which apply a protective gum coating to the plate. Gum is applied to roller 44 by gum dispensing tube 48. Gum dispensing tube 48 is also provided with the pulsed spray system of the present invention. The plate then passes through air dryers 50 and 52 and thence through exit rollers 54 and 56. The plate is now ready for printing or storage.

EXAMPLE

A prototype processor for positive working lithographic printing plates, as illustrated in FIG. 2, was provided with pulsed spray developer dispensing nozzles, rinse dispensing nozzles and gum dispensing tube. The plate used was an "Enco P-200," a positive working plate manufactured by Azoplate, a division of American Hoechst Corporation. The plate was exposed through ultraviolet light in a Nu Arc plate exposure device Model No. FT 40M for 60 seconds. The exposed plate was inserted into the feed rollers of the processing machine at a linear speed of 42 inches per minute. The developer used was Enco PD-140, also a product of the Azoplate division of American Hoechst Corporation. The equipment (not shown in FIG. 2) used to spray the developer, rinse, and finisher upon the plate included the following components: A piston-type "Hypro" pump, series No. C-5320, made by Lear-Siegler Corporation, operating at a speed of 900 r.p.m. and delivering 0.2 gallons per minute at 60 p.s.i. was used for developer and rinse. For the gum solution, the pump used was a "Hypro" model No. B12, of the vane type, operating at 1,800 r.p.m. and delivering fluid at 20 p.s.i. The solenoid valve was a normally closed valve made by American Switch Company, catalog No. 8262A220. An electric timer, made by Industrial Solid State Company, model No. 1061, operating 1 second open and 1 second closed was provided. The spray heads were made by Wm. Steinen Mfg. Co., Model No. F101 Flo-Jet. All three fluid dispensing units were controlled by one timer. The pulsed spray of developer penetrated the coating and loosened it from the surface of the carrier. The rotary brush removed the balance. The rinse fluid Enco PF-2 made by Azoplate, a division of American Hoechst Corporation, neutralized the residual developer fluid. After passage through the transport squeegee rolls, the plate received an application of Enco's Subtractive Finisher, also a product of Azoplate. The completely processed plate was delivered from the machine ready for press or storage.

The plate was examined for appearance. It was found that development was complete and the non-image areas were free of residual coating. The finest highlight dots, 2%, were all present, while the 97% shadow dots, were well defined. The consumption of expensive developer and rinse was 1 oz. per square foot of printing plate processed of each fluid. In a similar test using a continuous spray system, the consumption of developer and rinse was 2 oz. per square foot in order to achieve equivalent completeness of processing. This clearly shows the effectiveness and economy of the pulsed spray method of the present invention. Repeated tests at other test locations over a period of time confirmed the results set forth above.

The present pulsed spray technique can be used for gravure or chemical machine etching, photo-chemical machining, development of photosensitive lithographic and letterpress plates (such as Dycril, Nyloprint and Letterflex) for the application of protective and decorative coatings, especially on roughened surfaces, etc.

As indicated, the pulsed spray of this invention results in additional impingement and penetration forces as compared with conventional continuous spray techniques. In addition, less spray material is used and/or greater surface coverage with the same amount of spray is attained. In photosensitive material treating processes, less image attack and more non-image removal is possible than if one used a more potent solvent composition. The latter type of solution will have a tendency to damage wanted images even though non-image areas are more thoroughly removed. In coating applications, better penetration and adhesion result.

It will be obvious to those skilled in the art that many modifications may be made within the scope of the present invention without departing from the spirit thereof, and the invention includes all such modifications.

What is claimed is:

1. Apparatus for automatically spraying a liquid on the surface of a moving object comprising, transport means for transporting said object, spray means mounted adjacent the path of travel of said object for spraying an impinging spray of said liquid onto a predetermined area of said surface of said object as said object passes said spray means, distribution line means operatively coupled to said spray means, supply means operatively coupled to said distribution line for continuously supplying said liquid to said distribution line and pulsing means operatively coupled to said distribution line for repetitively and alternately passing said liquid through said spray means for a sufficiently short, first, predetermined period of time to maintain an essentially constant, predetermined pressure on said liquid issuing through said spray means and interrupting the passage of said liquid through said means for a sufficiently long, second, predetermined period of time to build up said predetermined pressure and for repetitively passing said liquid through said spray means at a rate sufficient to deposit a continuous coating of said liquid on said predetermined area of said object.

2. Apparatus in accordance with claim 1 wherein the apparatus is apparatus for processing an exposed, photosensitive printing plate.

3. Apparatus in accordance with claim 2 wherein the printing plate is a lithographic plate.

4. Apparatus in accordance with claim 2 wherein the printing plate is a photopolymer letterpress plate.

5. Apparatus in accordance with claim 1 wherein the object is a flat sheet material and the transport means is a pair of feed rollers.

6. Apparatus in accordance with claim 2 wherein the liquid is a developer liquid.

7. Apparatus in accordance with claim 2 wherein the liquid is a rinse liquid.

8. Apparatus in accordance with claim 2 wherein the liquid is a gumming liquid.

9. Apparatus in accordance with claim 1 wherein the spray means is a plurality of spray heads spaced from one another.

10. Apparatus in accordance with claim 9 wherein the object is a flat sheet material and the spray heads are spaced in a single row across the width of said sheet transverse in the direction of travel of said sheet past said spray heads.

11. Apparatus in accordance with claim 1 wherein the supply means is a pump means.

12. Apparatus in accordance with claim 1 wherein the pulsing means is an automatically operated valve means mounted in the distribution line.

13. Apparatus in accordance with claim 12 wherein the valve means is a solenoid operated valve means.

14. Apparatus in accordance with claim 12 wherein the pulsing means includes automatic timing means operatively coupled to the valve means.

15. Apparatus in accordance with claim 1 wherein the first and second predetermined periods are equal in time.

* * * * *